United States Patent [19]
Tokumo et al.

[11] 4,418,323
[45] Nov. 29, 1983

[54] OSCILLATOR HAVING CAPACITOR CHARGED AND DISCHARGED BY CURRENT MIRROR CIRCUITS

[75] Inventors: Akio Tokumo; Yoshiro Kunugi, both of Saitama, Japan

[73] Assignee: Pioneer Electronic Corporation, Tokyo, Japan

[21] Appl. No.: 240,686

[22] Filed: Mar. 5, 1981

[30] Foreign Application Priority Data

Mar. 7, 1980 [JP] Japan ............................ 55/28838
Mar. 7, 1980 [JP] Japan ............................ 55/28839
Mar. 10, 1980 [JP] Japan ............................ 55/29216

[51] Int. Cl.³ ........................................ H03K 3/282
[52] U.S. Cl. ........................ 331/111; 331/108 A; 331/143
[58] Field of Search .......... 331/108 A, 108 D, 108 C, 331/111, 113 R, 143, 144

[56] References Cited
U.S. PATENT DOCUMENTS

| | | | |
|---|---|---|---|
| 3,886,485 | 5/1975 | Takahashi | 331/111 |
| 4,035,744 | 7/1977 | Fukaya et al. | 331/111 |
| 4,336,507 | 6/1982 | Bynum et al. | 331/111 |

Primary Examiner—Siegfried H. Grimm
Assistant Examiner—Tim A. Wiens
Attorney, Agent, or Firm—Sughrue, Mion, Zinn, Macpeak and Seas

[57] ABSTRACT

An oscillator circuit adapted for use as a voltage controlled oscillator in which all of the transistors of the oscillator circuit are operated in non-saturated regions so that the minority carrier accumulation time does not affect the maximum operating frequency of the circuit. First and second current mirror circuits are coupled to opposed outputs of a differential amplifier circuit and are coupled to charge and discharge a capacitor with constant current in response to the states of the differential amplifier circuit. The differential amplifier circuit is provided with a hysteresis characteristic.

10 Claims, 18 Drawing Figures

FIG. 1 PRIOR ART
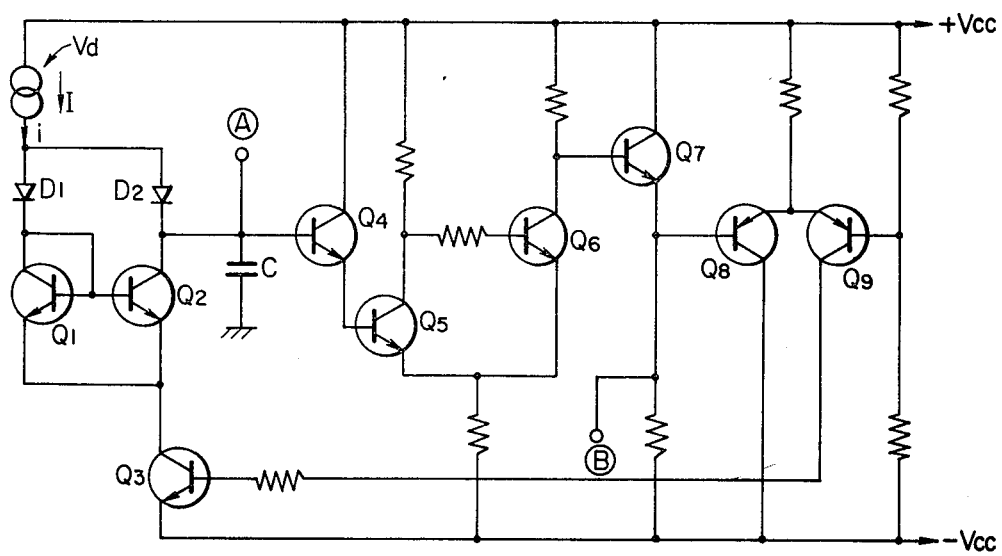
FIG. 2
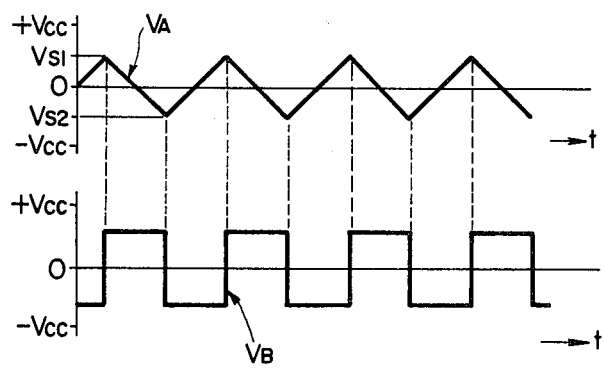
FIG. 3A
FIG. 3B
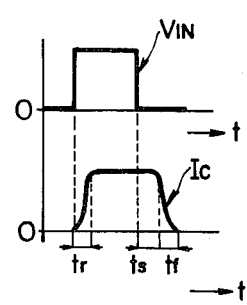

4,418,323

OSCILLATOR HAVING CAPACITOR CHARGED AND DISCHARGED BY CURRENT MIRROR CIRCUITS

BACKGROUND OF THE INVENTION

The present invention relates to an oscillator circuit adapted for use in a voltage controlled oscillator (VCO) of a PLL circuit or a carrier signal oscillator of a PWM demodulator.

Shown in FIG. 1 is an example of a conventional voltage controlled oscillator circuit. This oscillator circuit operates in the following manner. When a transistor $Q_3$ is in the non-conductive state, a capacitor C is charged by a current i flowing from a constant current source I via a diode $D_2$. At the instant when the charged voltage of the capacitor C exceeds an inversion threshold voltage of a Schmitt trigger circuit including transistors $Q_4$–$Q_6$, the transistor $Q_6$ is rendered non-conductive, the resistance between the collector and the emitter of the transistor $Q_7$ decreases, a transistor $Q_8$ forming a differential amplifier circuit together with a transistor $Q_9$ is rendered non-conductive, the counterpart transistor $Q_9$ is rendered conductive, and then the transistor $Q_3$ is rendered conductive. In this manner, the state of the circuit is inverted as a result of which a current mirror circuit including transistor $Q_1$ and $Q_2$ operates so that the current i from the constant current source I flows into the transistor $Q_1$ and the identical amount of current i is sunk by the transistor $Q_2$ from the capacitor C. As a result of the discharge from the capacitor C, when the voltage across the capacitor C falls below a reset threshold voltage of the Schmitt trigger circuit to reset the latter, the transistor $Q_6$ is rendered conductive, the resistance across the collector and the emitter of the transistor $Q_7$ increases, the transistor $Q_8$ is rendered conductive, the transistor $Q_9$ is rendered non-conductive, and the transistor $Q_3$ is rendered non-conductive. In this manner, the circuit returns to the initial state so that the current mirror circuit becomes inoperable and the capacitor C is again charged.

Accordingly, a triangular waveform voltage $V_A$ is developed at a terminal A to which the voltage of the capacitor C is outputted. A rectangular waveform voltage $V_B$ of identical duration (identical frequency) to that of the triangular waveform voltage $V_A$ is produced at the emitter of the transistor $Q_7$. The frequency of the rectangular waveform voltage $V_B$ is proportional to the amount of the current i. In FIG. 2, there are shown waveform diagrams in which $V_{S1}$ and $V_{S2}$ represent the inversion threshold voltage of the Schmitt trigger circuit and the reset threshold voltage thereof, respectively, and $+V_{cc}$ and $-V_{cc}$ are power supply voltages.

The Schmitt trigger circuit of the oscillator circuit shown in FIG. 1 operates, with the utilization of the positive feedback of the transistors $Q_5$ and $Q_6$, with the transistors thereof in their saturated regions. Accordingly, the following disadvantages are encountered. Specifically, in the case where a rectangular waveform pulse $V_{IN}$ as shown in FIG. 3A is applied as an input voltage to the transistor, the collector current $I_c$ involves a minority carrier accumulation time $t_s$ as shown in FIG. 3B. In FIG. 3B, $t_r$ and $t_f$ are representative of a rise time and a fall time, respectively. Due to the minority carrier accumulation time, the operation of the transistor is delayed and high speed operation cannot be accomplished. For this reason, the circuit of FIG. 1 is unable to oscillate at a high frequency. In other words, the oscillator circuit shown therein has limited application as a high speed oscillator.

In view of the foregoing, an object of the invention is to provide an oscillator circuit in which the transistors used in the various parts of the circuit are operated in non-saturated regions so as to eliminate the minority carrier accumulation time thereby greatly improving the operational speed of the circuit.

SUMMARY OF THE INVENTION

In accordance with this and other objects of the invention, there is provided an oscillator circuit including a first current mirror circuit for charging a capacitor with a constant current and a second current mirror circuit for discharging the capacitor with the same magnitude of constant current. A differential amplifier circuit is provided having a first input terminal to which the voltage of the capacitor is applied and a second input terminal coupled to a source of a potential which varies in response to an operating condition of the differential amplifier to thereby provide the differential amplifier with a hysteresis characteristic. The first and second current mirror circuits for charging and discharging the capacitor are differentially operated in response to the outputs of the differential amplifier circuit.

BRIEF DESCRIPTION OF THE DRAWINGS

FIG. 1 is a circuit diagram showing a prior art oscillator circuit;

FIG. 2 is a waveform diagram of an oscillation output of the circuit shown in FIG. 1;

FIGS. 3A and 3B are explanatory diagrams for an explanation of an operational delay caused by the carrier accumulation time of which FIG. 3A is an input voltage waveform applied to the transistor and FIG. 3B is a waveform diagram of the collector current flowing therethrough;

DESCRIPTION OF THE PREFERRED EMBODIMENTS

A preferred embodiment of the oscillator circuit according to the invention will be described with reference to FIGS. 4–12c.

Figure 4:
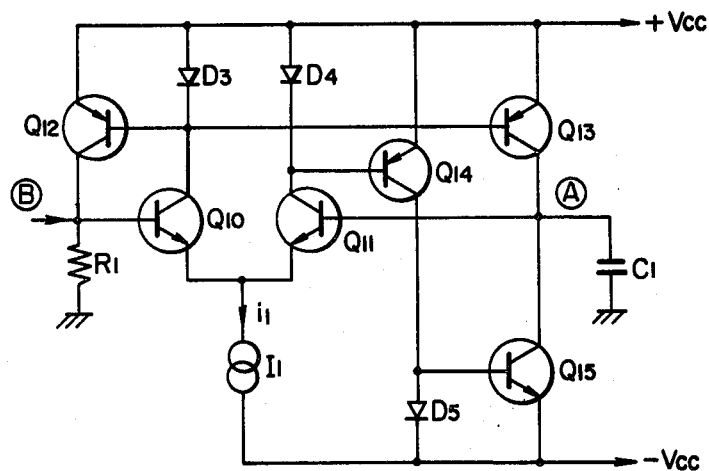
FIG. 4 is a circuit diagram showing a first embodiment of an oscillator circuit according to the invention.

In FIG. 4, transistors $Q_{10}$ and $Q_{11}$ constitute a differential amplifier in which a first current mirror circuit composed of a transistor $Q_{12}$ and a diode $D_3$ and a second current mirror circuit including a transistor $Q_{13}$ and the diode $D_3$ are connected to the collector of the transistor $Q_{10}$. To the collector of the counterpart transistor $Q_{11}$ of the differential amplifier circuit a third current mirror circuit composed of a transistor $Q_{14}$ and a diode $D_4$ is connected. A fourth current mirror circuit including a diode $D_5$ and a transistor $Q_{15}$ is coupled to the collectors of the transistors $Q_{13}$ and $Q_{14}$. A resistor $R_1$ across which a voltage is developed by the collector current of the transistor $Q_{12}$ is connected to the base of the transistor $Q_{10}$ forming the differential amplifier while a common juncture point of the collectors of the transistors $Q_{13}$ and $Q_{15}$ is connected to the base of the counterpart transistor $Q_{11}$. A capacitor $C_1$ is connected between the common juncture point of the collectors of the transistors $Q_{13}$ and $Q_{15}$ and ground.

The operation of this circuit will be described. It is assumed that the transistor $Q_{10}$ of the differential amplifier circuit is conducting and the counterpart transistor $Q_{11}$ thereof is non-conducting. In this condition, the first current mirror circuit including the diode $D_3$ and the transistor $Q_{12}$ and the second current mirror circuit composed of the diode $D_3$ and the transistor $Q_{13}$ are operated and a current $i_1$ identical to the current of the constant current source $I_1$ flows in the respective collectors of the transistors of the first and the second current mirror circuits. The transistors $Q_{14}$ and $Q_{15}$ included respectively in the third and the fourth current mirror circuits are in the non-conducting state. Accordingly, a voltage defined by $R_1 \cdot i_1$ is applied to the base of the transistor $Q_{10}$ as the inversion threshold voltage. A current $i_1$ identical to the current of the constant current source $I_1$ then flows through the transistor $Q_{13}$ to the capacitor $C_1$ to thereby charge the capacitor. The voltage across the capacitor $C_1$ is applied to the base of the counterpart transistor $Q_{11}$ forming the differential circuit.

When the charged voltage of the capacitor $C_1$ exceeds the inversion threshold voltage of the base of the transistor $Q_{10}$, the state of the differential amplifier circuit is inverted whereby the transistor $Q_{10}$ is rendered non-conducting and the transistor $Q_{11}$ rendered conductive. As a result, the transistors $Q_{12}$ and $Q_{13}$ of the first and second current mirror circuits are rendered non-conductive and the transistors $Q_{14}$ and $Q_{15}$ of the third and fourth current mirror circuits rendered conductive.

At this time, the current $i_1$ of the constant current source $I_1$ flows through the transistor $Q_{14}$ and accordingly the current $i_1$ also flows through the transistor $Q_{15}$. That is, the current $i_1$ is produced as a discharge current from the capacitor $C_1$ into the transistor $Q_{15}$. When the transistor $Q_{12}$ is in the non-conductive state, the base voltage of the transistor $Q_{10}$ is zero, which is the reset threshold voltage of the differential amplifier circuit. Specifically, the differential amplifier circuit is provided with a hysteresis characteristic whereby the inversion and reset threshold voltage are made different. As the discharge of the capacitor $C_1$ proceeds and the base voltage of the transistor $Q_{11}$ falls below the reset threshold voltage, the transistor $Q_{11}$ changes to the non-conductive state and the transistor $Q_{10}$ to the conductive state. In this manner, the circuit returns to the initial state and the charging of the capacitor $C$ is again carried out.

From the foregoing operation, a triangular waveform output $V_A$ appears at the non-grounded terminal A of the capacitor $C_1$ and a rectangular waveform output $V_B$ appears at the non-grounded terminal of the resistor $R_1$. The peak-to-peak values of both outputs are equal to each other as illustrated in FIGS. 5A and 5B.

Figure 6:
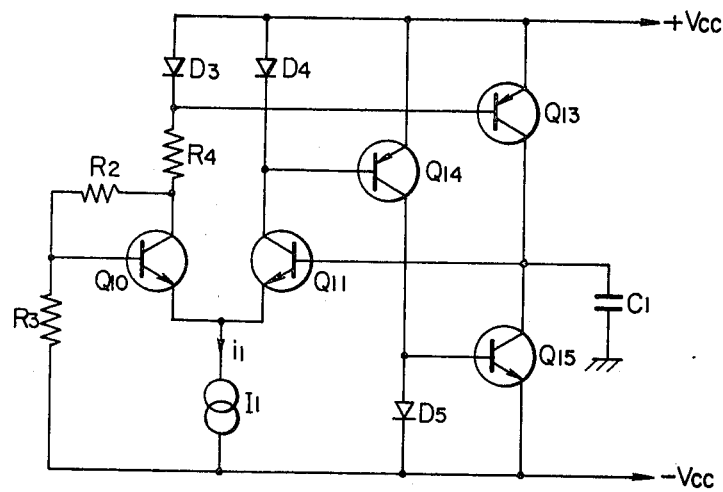
FIG. 6 is a circuit diagram showing a second embodiment of an oscillator circuit according to the invention.

FIG. 6 is a schematic diagram of a second embodiment of an oscillator circuit according to the invention. Application of the base potential of the transistor $Q_{10}$ forming the differential amplifier circuit is imparted by the collector potential thereof divided by the ratio of the resistances of resistors $R_2$ and $R_3$. In this embodiment, since the base potential of the transistor $Q_{10}$ is different at the times of conduction and non-conduction of the transistor $Q_{10}$, a hysteresis characteristic is provided for the differential amplifier circuit. The operation of the circuit of this embodiment is otherwise similar to that of FIG. 4.

Figure 5:
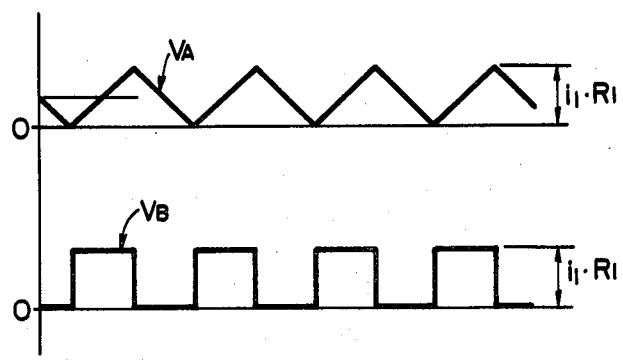
FIG. 5 is a waveform diagram of the oscillation output of the circuit shown in FIG. 4.

In the oscillator circuits shown in FIGS. 4 and 5, in the case where the gain of the differential amplifier circuit is small, a circuit arrangement may be employed in which the differential amplifier circuit is a cascade-connected two stage circuit. If a high impedance circuit is coupled to the capacitor $C_1$ as a load, no problem will arise if a buffer circuit is interconnected between the base of the transistor $Q_{11}$ and the capacitor $C_1$ in order to improve the linearity of the triangular waveform output $V_A$.

Furthermore, in the above described embodiments, if the current $i_1$ of the constant current source $I_1$ is increased, the peak output values increase in the embodiment shown in FIG. 4. In the same embodiment, by the employment of a constant voltage element such as Zener diode instead of the resistor $R_1$ or $R_3$, the oscillation frequency can be made to vary in response to the current variations of the constant current source $I_1$ thus making it possible to use the circuit as VCO. In the embodiment shown in FIG. 6, in response to the current variations of the constant current source $I_1$, the oscillation frequency and the peak output value vary.

Figure 7:
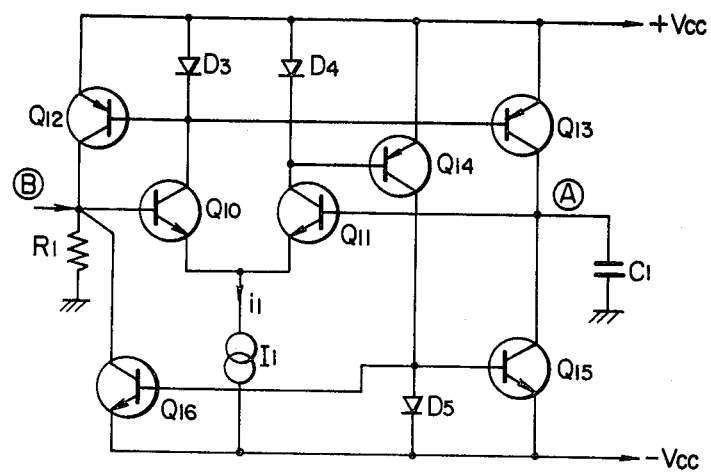
FIG. 7 is a circuit diagram showing a third embodiment of an oscillator circuit according to the invention.
Figure 8:
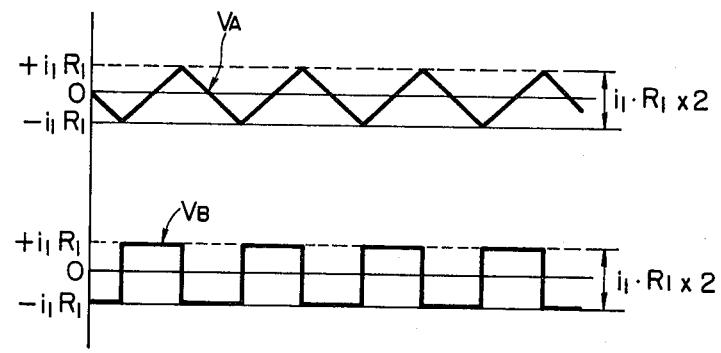
FIG. 8 is a waveform diagram of the oscillation output of the circuit shown in FIG. 7.

FIG. 7 is a circuit diagram showing a third embodiment of an oscillator circuit according to the invention. The third embodiment is a modification of the first embodiment shown in FIG. 4 in which a fifth current mirror circuit composed of a transistor $Q_{16}$ and a diode $D_5$ is added to the circuit arrangement of the first embodiment coupled to the base of the transistor $Q_{10}$. In this embodiment, when the transistor $Q_{14}$ is in the conducting state and the current $i_1$ flows through the transistor $Q_{16}$, the base potential of the transistor $Q_{10}$ becomes $-R_1 I_1$. The potential of $-R_1 I_1$ is set to be the reset threshold voltage of the differential amplifier circuit so that the upper and the lower peak values of both the triangular waveform output and the rectangular waveform output at the terminals A and B are $+I_1 R_1$ and $-I_1 R_1$ as shown in FIG. 8.

Figure 9:
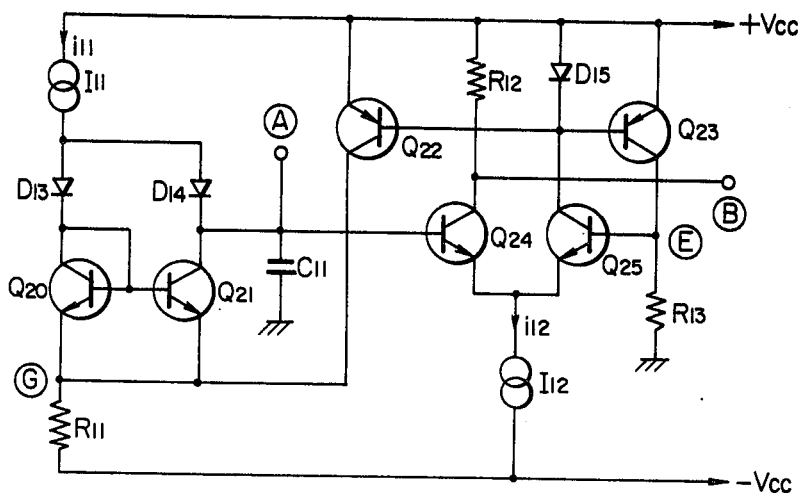
FIG. 9 is a circuit diagram showing a fourth embodiment of an oscillator circuit according to the invention.
Figure 10A:
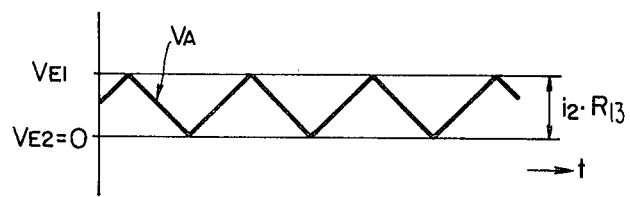
FIGS. 10A through 10D are waveform diagrams of the oscillation outputs of the circuit shown in FIG. 9.
Figure 10B:
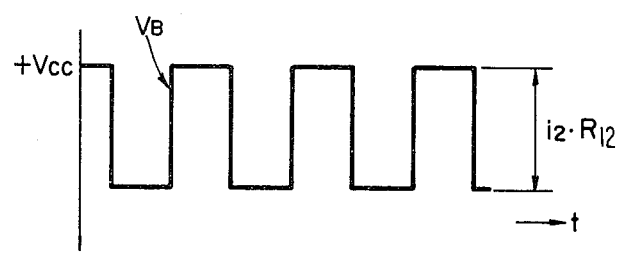
Figure 10C:
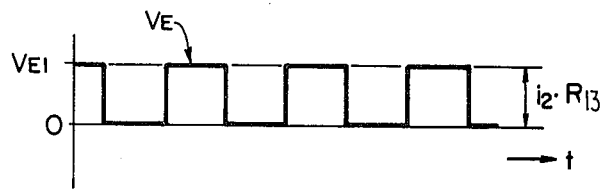
Figure 10D:
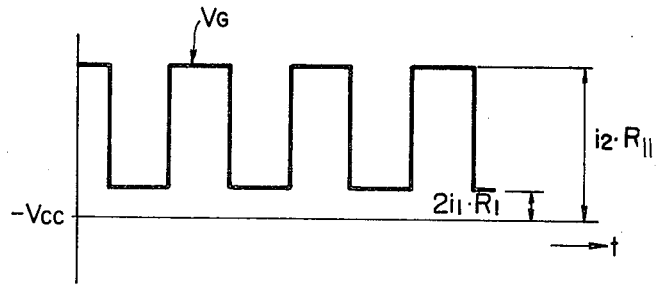

A fourth embodiment of an oscillator circuit according to the invention will be described with reference to FIGS. 9 and 10. Referring to FIG. 9, diodes $D_{13}$ and $D_{14}$ and transistors $Q_{20}$ and $Q_{21}$ constitute a current mirror circuit whose arrangement is similar to that shown in FIG. 1 with the exception that the operation thereof is controlled by the voltage developed across a resistor $R_{11}$ connected in series to the current mirror circuit. Specifically, when the voltage across the resistor $R_{11}$ exceeds a predetermined value, both the transistors $Q_{20}$ and $Q_{21}$ are rendered non-conductive and the current $i_{11}$ from a constant current source $I_{11}$ flows to a capacitor $C_{11}$ through the diode $D_{14}$ so as to charge the capacitor $C_{11}$. Inversely, when the voltage across the resistor $R_{11}$ falls below the predetermined value, both the transistors $Q_{20}$ and $Q_{21}$ are rendered conductive and the current $i_{11}$ from the constant current source $I_{11}$ flows through the transistor $Q_{20}$. Thus, the current $i_{11}$, which is idential to the current from the constant current source $I_{11}$, flows as a discharge current from the capacitor $C_{11}$ to the transistor $Q_{21}$. The resistance value of the resistor $R_{11}$ is determined so that the voltage $V_{CE}$ (the voltage across the collector and the emitter) of the transistor $Q_{21}$ is set to be more than twice as large as a threshold level $V_F$ of the diode $D_{14}$. Hence, the diode $D_{14}$ is rendered non-conductive and the flow of the charge into the capacitor $C_{11}$ is blocked.

A diode $D_{15}$ and a transistor $Q_{22}$ constitute one current mirror circuit and the diode $D_{15}$ and a transistor $Q_{23}$ constitute another current mirror circuit. These two current mirror circuits operate in response to the conduction of a transistor $Q_{25}$ which constitutes a differential amplifier circuit together with a transistor $Q_{24}$. A current identical to the current $i_2$ of a constant current source $I_{12}$ of the differential amplifier circuit flows through the collectors of the transistors $Q_{22}$ and $Q_{23}$. Voltages $i_{12} \cdot R_{13}$ and $i_{12} \cdot R_{11}$ are developed across the resistors $R_{13}$ and $R_{11}$, respectively, and the latter voltage is set so as to render the transistors $Q_{20}$ and $Q_{21}$ non-conductive.

In the above-described differential amplifier circuit, the transistor $Q_{25}$ is rendered non-conductive in accordance with the conduction of the transistor $Q_{24}$ to the base of which the voltage of the capacitor $C_1$ is applied to thereby render non-conductive the transistor $Q_{23}$ of the current mirror circuit. Therefore, the base potential of the transistor $Q_{25}$ which is rendered non-conductive is substantially zero. Thus, due to the base potential of the transistor $Q_{25}$, which functions as a reference element in operation, a hysteresis characteristic is provided.

The operation of the circuit shown in FIG. 9 will next be described. Assuming now that the transistor $Q_{24}$ is non-conductive, the counterpart transistor $Q_{25}$ of the differential amplifier circuit is conductive and the current $i_{12}$ from the constant current source $I_{12}$ flows through the collector of the latter transistor. Accordingly, the current $i_{12}$ also flows in the transistors $Q_{22}$ and $Q_{23}$ of the repsective current mirror circuits and the inversion threshold voltage $V_{E1}$ of the diifferential amplifier circuit is $i_{12} \cdot R_{13}$. Further, a voltage $i_{12} \cdot R_{11}$ is developed across the resistor $R_{11}$, and the transistor $Q_{20}$ and $Q_{21}$ are thereby rendered non-conductive.

Therefore, the current $i_{11}$ from the constant current source $I_{11}$ flows through the capacitor $C_{11}$ through the diode $D_{14}$ to thereby charge the capacitor. When the voltage across the capacitor $C_{11}$ exceeds the base potential ($i_{12} \cdot R_{13}$) of the transistor $Q_{25}$ as a result of the charging of the capacitor $C_{11}$, the transistor $Q_{24}$ is rendered conductive and the transistor $Q_{25}$ is rendered non-conductive, while both the transistors $Q_{22}$ and $Q_{23}$ are rendered non-conductive and the current $i_{12}$ does not flow through the resistors $R_{11}$ and $R_{13}$.

Consequently, the base potential of the transistor $Q_{25}$ is near zero, which is the reset threshold voltage $V_{E2}$ of the differential amplifier circuit. The current mirror circuit including the transistors $Q_{20}$ and $Q_{21}$ then commences its operation whereby the current $i_{11}$ of the constant currrent source $I_{11}$ flows through the transistor $Q_{20}$ and the same amount of the discharge current $i_{11}$ from the capacitor $C_{11}$ also flows through the transistor $Q_{21}$. Accordingly, the voltage across th capacitor $C_{11}$ is gradually lowered. The voltage $2i_{11} \cdot R_{11}$ is developed across the resistor $R_{11}$. When the voltage across the capacitor $C_{11}$ falls below the reset threshold voltage, the transistor $Q_{24}$ is rendered non-conductive whereas the transistor $Q_{25}$ is rendered conductive. Thus, the circuit returns to the initial state and thereafter the same operation is repeatedly carried out.

In FIGS. 10A–10D, there are shown, respectively, the waveform of the triangular waveform output $V_A$ at the terminal A, the rectangular waveform output $V_B$ at the terminal B, the threshold voltage $V_E$ at the point E, and the bias voltage $V_G$ at the point G.

In the circuit arrangement shown in FIG. 9, with the capacitance value of the capacitor $C_{11}$ constant, the frequencies of the triangular waveform output $V_A$ and the rectangular waveform output $V_B$ vary in proportion to the level of the current $i_{11}$ of the constant current source $I_{11}$. Therefore, if the current of the constant current source $I_{11}$ is varied by control of the voltage, a voltage controlled oscillator circuit results.

In the embodiment described, it is further possible to impart the hysteresis characteristic to the differential amplifier circuit by the employment of a Zener diode instead of the resistor $R_{13}$.

As described above, the invention is directed to an oscillator circuit including the current mirror circuit connected to the constant current source which receives from the capacitor the same amount of current as that supplied from the constant current source, and the differential amplifier circuit to which the hysterisis characteristic is imparted. The voltage across the capacitor is applied as the input voltage, wherein while controlling the operation of the current mirror circuit in response to the output of the differential amplifier circuit, the current from the constant current source charges the capacitor in accordance with the non-operation of the current mirror circuit. The same amount of current as the current of the constant current source flows as a discharge current from the capacitor in accordance with the operation of the current mirror circuit.

An oscillator circuit according to a fifth embodiment of the invention will be described with reference to FIGS. 11 and 12.

Figure 11:
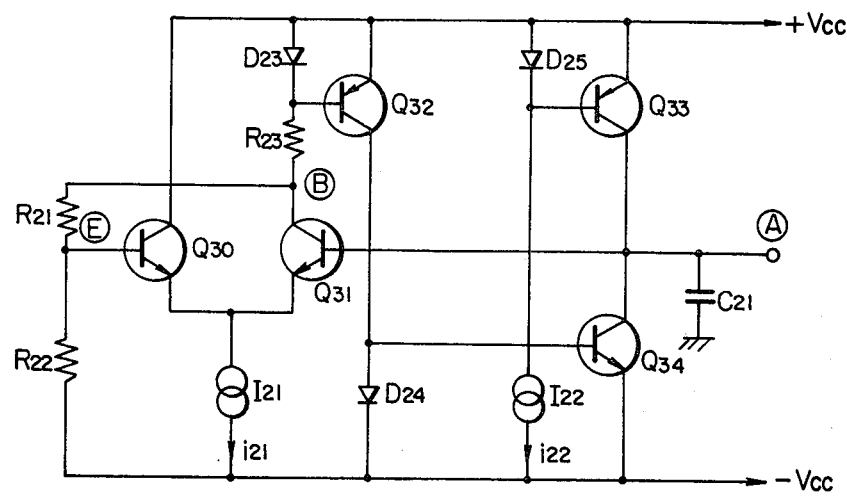
FIG. 11 is a circuit diagram showing a fifth embodiment of an oscillator circuit according to the invention.

In FIG. 11, transistors $Q_{30}$ and $Q_{31}$ and a constant current source $I_{21}$ constitute a differential amplifier circuit in which the voltage across a capacitor $C_{21}$ is applied to the base of the transistor $Q_{31}$ while applied to the base of the counterpart transistor $Q_{30}$ is the collector voltage of the transistor $Q_{31}$ subjected to voltage division by resistors $R_{21}$ and $R_{22}$. Accordingly, if the differential amplifier circuit is used in such a manner that the base of the transistor $Q_{31}$ is a control point and the base of the counterpart transistor $Q_{30}$ is a threshold voltage setting point, the threshold voltage of the differential amplifier circuit varies in accordance with the condition of the transistor $Q_{31}$. Therefore, the hysteresis characteristic is imparted to the differential amplifier circuit in the operations of the inversion and reset thereof.

A diode $D_{23}$ and a transistor $Q_{32}$ constitute a first current mirror circuit which operates when the transistor $Q_{31}$ is conductive. A diode $D_{24}$ and a transistor $Q_{34}$ constitute a second current mirror circuit which operates when the first current mirror circuit is in operation. Discharge current flowing from the capacitor $C_{21}$ is sunk by the second current mirror circuit. A diode $D_{25}$ and a transistor $Q_{33}$ constitute a third current mirror circuit which is in operation at all times. A current identical to the current $i_{22}$ of a constant current source $I_{22}$ flows through the transistor $Q_{33}$. With respect to the current $i_{21}$ and $i_{22}$ of the constant current source $I_{21}$ and $I_{22}$, a relationship of $i_{21}=2i_{22}$ in maintained therebetween.

The operation of the foregoing circuit arrangement will now be described. In the case when the transistor $Q_{30}$ is in the conducting state and the counterpart transistor $Q_{31}$ of the differential amplifier circuit is in the non-conducting state, the inversion threshold voltage $V_{E1}$ of the differential amplifier circuit is a high value. Moreover, due to the non-conduction of the transistor $Q_{31}$, the transistors $Q_{32}$ and $Q_{34}$ of the first and second current mirror circuits are in non-conducting states. Accordingly, in this case a current identical to the current of the constant current source $I_{22}$ flows through the capacitor $C_{21}$ from the transistor $Q_{33}$ forming the third current mirror circuit. (The base current of the transistor $Q_{31}$ is neglegible.)

When the charged voltage of the capacitor $C_{21}$ exceeds the inversion threshold voltage $V_{E1}$, the differential amplifier circuit is inverted to cause the transistor $Q_{31}$ to be conductive and the transistor $Q_{30}$ to be non-conductive. Therefore, the reset threshold voltage $V_{E2}$ of the differential amplifier circuit becomes a lower value. Further, the transistors $Q_{32}$ and $Q_{34}$ of the first and second current mirror circuits become conductive and a current identical to that of the constant current source $I_{21}$ of the differential amplifier flows therethrough. Since the relationship $i_{21}=2i_{22}$ is maintained, the current $i_{22}$ is sunk by the transistor $Q_{34}$ from the transistor $Q_{33}$ and further the same amount of current $i_{22}$ is sunk from the capacitor $C_{21}$.

Consequently, the current $i_{22}$, equal to the charge current, flows as a discharge current from the capacitor $C_{21}$ so that the voltage across the capacitor $C_{21}$ is lowered. When the voltage falls below the reset threshold voltage $V_{E2}$ of the differential amplifier circuit, the differential amplifier circuit is reset whereby the transistor $Q_{31}$ is rendered non-conductive and the transistor $Q_{30}$ is rendered conductive.

Figure 12A:
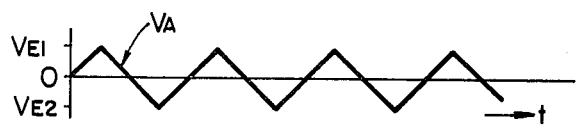
FIGS. 12A–12C are waveform diagrams of the oscillation outputs of the circuit shown in FIG. 11.
Figure 12B:
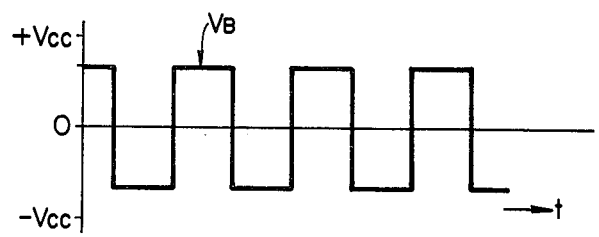
Figure 12C:
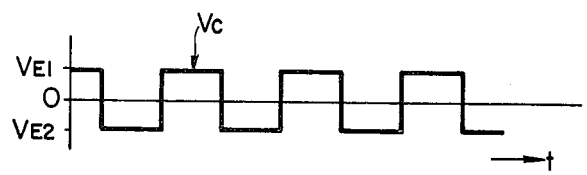

With the operation as described above, the circuit returns to the initial state and again the current $i_{22}$ flows to charge the capacitor $C_{21}$. The foreoing operation is thereafter repeatedly carried out resulting in a triangular waveform output $V_A$ at the non-grounded terminal A of the capacitor $C_{21}$ while the rectangular waveform output $V_B$ is present at the collector terminal B of the transistor $Q_{31}$. The waveform of the output $V_A$ is represented in FIG. 12A, the waveofrm of the output $V_B$ in FIG. 12B, and the waveform of the base voltage of the transistor $Q_{30}$ (the threshold voltage of the differential amplifier circuit) in FIG. 12C.

The frequencies of the outputs $V_A$ and $V_B$ are proportional to the level of the current $i_{22}$ flowing into or out of the capacitor $C_{21}$. Therefore, if the constant current sources $I_{21}$ and $I_{22}$ are controlled while maintaining the relationship of $i_{21}=2i_{22}$, then the oscillation frequency and the peak output values can be varied. Hence, if the constant current sources $I_{21}$ and $I_{22}$ are designed so as to be controlled by input control voltages, a voltage controlled oscillator results.

As is apparent from the above-description, in accordance with the invention, since the circuit arrangement is such tht no transistors are operated in a positive feedback arrangement, there is no minority carrier accumulation time problem, and accordingly it is possible to increase the operational speed and provide a high frequency oscillation signal.

What is claimed is:

1. An oscillator circuit comprising: a differential amplifier having a first transistor receiving a first differential amplifier input and providing a first differential amplifier output and a second transistor receiving a second differential amplifier input and providing a second differential amplifier output, said differential amplifier being operable in a first state wherein a predetermined current flows in said first transistor and a second state wherein said predetermined current flows in said second transistor; first and second current mirror circuits coupled to said first output of said differential amplifier for conducting currents equivalent to that flowing in said first transistor; a third current mirror circuit coupled to said second output of said differential amplifier for conducting a current equivalent to that flowing in said second transistor; a fourth current mirror circuit coupled to an output of said third current mirror for conducting a current equivalent to that flowing in said third current mirror circuit; and a capacitor coupled to said second differential amplifier input and coupled to be charged by current flowing through said second current mirror circuit and discharged by current flowing through said fourth current mirror circuit and wherein an output of said first current mirror circuit is coupled to said first input of said differential amplifier.

2. An oscillator circuit comprising: a constant current source; a first NPN transistor having an emitter coupled to a first terminal of said constant current source; a second NPN transistor having an emitter coupled to said first terminal of said constant current source; a third PNP transistor having a collector coupled to a base of said first transistor; a resistor having a first terminal coupled to said base of said first transistor and a second terminal coupled to ground; a first diode having an anode coupled to a positive voltage source and a cathode coupled to a collector of said first transistor and a base of said third transistor, an emitter of said third transistor being coupled to said positive voltage source; a second diode having an anode coupled to said positive voltage source and a cathode coupled to a collector of said second transistor; a fourth PNP transistor having a base coupled to said collector of said first transistor, an emitter coupled to said positive voltage source and a collector coupled to a base of said second transistor; a fifth PNP transistor having a base coupled to said collector of said second transistor and an emitter coupled to said positive voltage source; a third diode having an anode coupled to a collector of said fifth transistor and a cathode coupled to a second terminal of said constant current source and to a negative voltage source; a sixth NPN transistor having a base coupled to said anode of said third diode, a collector coupled to said collector of said fourth transistor and an emitter coupled to said negative voltage source; and a capacitor having a first terminal coupled to said collector of said fourth transistor and a second terminal coupled to ground.

3. An oscillator circuit comprising: a differential amplifier circuit having a first transistor receiving a first differential amplifier input and providing a first differential amplifier output and a second transistor receiving a second differential amplifier input and providing a second differential amplifier output, said differential amplifier being operable in a first state wherein a predetermined current flows in said first transistor and a second state wherein said predetermined current flows in said second transistor; a first current mirror circuit coupled to said first output of said differential amplifier circuit for conducting a current equivalent to that flowing in said first transistor; a second current mirror circuit coupled to said second output of said differential amplifier circuit for conducting a current equivalent to that flowing in said second transistor; a third current mirror circuit coupled to an output of said second current mirror circuit; a capacitor coupled to be charged by current from said first current mirror circuit and discharged by current from said third current mirror circuit, and coupled to said second input of said differential amplifier circuit; and voltage divider means for supplying a voltage to said first input of said differential amplifier circuit in proportion to a current flowing at said first output.

4. An oscillator circuit comprising: a constant current source; a first NPN transistor having an emitter coupled to a first terminal of said constant current source; a second NPN transistor having an emitter coupled to said first terminal of said constant current source; a first diode having an anode coupled to a positive voltage source; a first resistor having a first terminal coupled to a cathode of said first diode and a second terminal coupled to a collector of said first transistor; a second resistor coupled between said collector of said first transistor and a base of said first transistor; a third resistor coupled between said base of said first transistor and a second terminal of said constant current source which is coupled to a negative voltage source; a second diode having an anode coupled to said positive voltage source and a cathode coupled to a collector of said second transistor; a third PNP transistor having an emitter coupled to said positive voltage source, a base coupled to said cathode of said first diode, and a collector coupled to a base of said second transistor; a fourth PNP transistor having a base coupled to said collector of said second transistor and an emitter coupled to said positive voltage source; a fifth NPN transistor having a collector coupled to said collector of said third transistor, a base coupled to said collector of said fourth transistor, and an emitter coupled to said negative voltage source; a third diode having an anode coupled to said base of said fifth transistor and a cathode coupled to said negative voltage source; and a capacitor having a first terminal coupled to said collector of said third transistor and a second terminal coupled to ground.

5. An oscillator circuit comprising: a differential amplifier circuit having a first transistor receiving a first differential amplifier input and providing a first differential amplifier output and a second transistor receiving a second differential amplifier input and providing a second differential amplifier output, said differential amplifier being operable in a first state wherein a predetermined current flows in said first transistor and a second state wherein said predetermined current flows in said second transistor; first and second current mirror circuits coupled to said first output of said differential amplifier circuit for conducting currents equivalent to that flowing in said first transistor; a third current mirror circuit coupled to said second output of said differential amplifier circuit for conducting a current equivalent to that flowing in said second transistor; a fourth current mirror circuit coupled to an output of said third current mirror circuit for conducting a current equivalent to that flowing in said third current mirror circuit; a capacitor coupled to said second differential amplifier input and coupled to be charged by current flowing through said second current mirror circuit and discharged by current flowing through said fourth current mirror circuit and wherein an output of said first current mirror circuit is coupled to a first input of said differential amplifier circuit; a fifth current mirror circuit having an input coupled to an output of said third current mirror circuit for conducting a current equivalent to that flowing in said second transistor; and a resistor coupled between said first input of said differential amplifier and ground, an output of said fifth current mirror circuit being coupled to said first input of said differential amplifier.

6. An oscillator circuit comprising: a constant current source; a first NPN transistor having an emitter coupled to a first terminal of said constant current source; a second NPN transistor having an emitter coupled to said first terminal of said constant current source; a third PNP transistor having a collector coupled to a base of said first transistor; a resistor having a first terminal coupled to said base of said first transistor and a second terminal coupled to ground; a first diode having an anode coupled to a positive voltage source and a cathode coupled to a collector of said first transistor and a base of said third transistor, an emitter of said third transistor being coupled to said positive voltage source; a second diode having an anode coupled to said positive voltage source and a cathode coupled to a collector of said second transistor; a fourth PNP transistor having a base coupled to said collector of said first transistor, an emitter coupled to said positive voltage source and a collector coupled to a base of said second transistor; a fifth PNP transistor having a base coupled to said collector of said second transistor and an emitter coupled to said positive voltage source; a third diode having an anode coupled to a collector of said fifth transistor and a cathode coupled to a second terminal of said constant current source and to a negative voltage source; a sixth NPN transistor having a base coupled to said anode of said third diode, a collector coupled to said collector of said fourth transistor and an emitter coupled to said negative voltage source; a capacitor having a first terminal coupled to said collector of said fourth transistor and a second terminal coupled to ground; and a seventh NPN transistor having a base coupled to said base of said sixth transistor, an emitter coupled to said negative voltage source and a collector coupled to said base of said first transistor.

7. An oscillator circuit comprising: a differential amplifier circuit having a first transistor receiving a first differential amplifier input and providing a first differential amplifier output and a second transistor receiving a second differential amplifier input and providing a second differential amplifier output, said differential amplifier being operable in a first state wherein a predetermined current flows in said first transistor and a second state wherein said predetermined current flows in said second transistor; first and second current mirror circuits having inputs coupled to said first output of said differential amplifier circuit for conducting currents equivalent to that flowing in said first transistor, said first current mirror circuit having an output coupled to said first input of said differential amplifier circuit; a constant current source; a third current mirror circuit having an input coupled through a first diode to said constant current source for conducting a current equivalent to that flowing in said constant current source; a capacitor coupled to said second differential amplifier input, coupled to an output of said third current mirror circuit and coupled through a second diode to said constant current source wherein said capacitor is charged with current supplied from said constant current source for a first operational state of said differential amplifier circuit and said capacitor is discharged through said third current mirror circuit for a second operational state of said differential amplifier circuit.

8. An oscillator circuit comprising: a first constant current source; a first NPN transistor having an emitter coupled to a first terminal of said first constant current source; a second NPN transistor having an emitter coupled to said first terminal of said constant current source; a first resistor coupled between a positive voltage source and a collector of said first transistor; a first diode having an anode coupled to said positive voltage source and a cathode coupled to a collector of said second transistor; a third PNP transistor having a base coupled to said cathode of said first diode, an emitter coupled to said positive voltage source and a collector coupled to a base of said second transistor; a second resistor coupled between said base of said second transistor and ground; a fourth PNP transistor having an emitter coupled to said positive voltage source and a base coupled to said base of said third transistor; a second constant current source having a first terminal coupled to said positive voltage source; second and third diodes having an anode coupled to a second terminal of said second constant current source; a fifth NPN transistor having a collector coupled to a cathode of said second diode and a base coupled to said collector of said fifth transistor; a sixth NPN transistor having a collector coupled to a cathode of said third diode and the base of said first transistor, a base connected to the base of said fifth transistor and an emitter coupled to an emitter of said fifth transistor and to a collector of said fourth transistor; a capacitor coupled between said collector of said sixth transistor and ground; and a third resistor coupled between said emitter of said fifth transistor and a second terminal of said first constant current source which is coupled to a negative voltage source.

9. An oscillator circuit comprising: a differential amplifier circuit having a first transistor receiving a first differential amplifier input and providing a first differential amplifier output and a second transistor receiving a second differential amplifier input and providing a second differential amplifier output, said differential amplifier being operable in a first state wherein a predetermined current flows in said first transistor and a second state wherein said predetermined current flows in said second transistor; a first current mirror circuit having an input coupled to said first output of said differential amplifier circuit for conducting a current equivalent to that flowing in said first transistor; a second current mirror circuit having an input coupled to an output of said first current mirror circuit for conducting a current equivalent to that flowing in said first transistor; a constant current source; a third current mirror circuit having an input coupled to said constant current source for conducting a current equivalent to that flowing in said constant current source; a capacitor coupled to be charged with a first polarity by said third current mirror circuit and charged with the opposite polarity by said second current mirror circuit and coupled to said first input of said differential amplifier; and voltage divider means having an input coupled to receive a current in proportion to a current flowing at said first ouput of said differential amplifier for supplying a voltage to said second input of said differential amplifier in proportion thereto.

10. An oscillator circuit comprising: a first constant current source; a first NPN transistor having an emitter coupled to a first terminal of said first constant current source and a collector coupled to a positive voltage source; a second NPN transistor having an emitter coupled to said first terminal of said first constant current source; a first diode having an anode coupled to said positive voltage source; a first resistor coupled between a cathode of said first diode and a collector of said second transistor; a third PNP transistor having an emitter coupled to said positive voltage source and a base coupled to said cathode of said first diode; a second resistor coupled between said collector of said second transistor and a base of said first transistor; a third resistor coupled between said base of said first transistor and a second terminal of said first constant current source which is coupled to a negative voltage source; a second diode having an anode coupled to a collector of said third transistor and a cathode coupled to said negative voltage source; a fourth PNP transistor having an emitter coupled to said positive voltage source and a collector coupled to a base of said second transistor; a third diode having an anode coupled to said positive voltage source and a cathode coupled to a base of said fourth transistor; a second constant current source having a first terminal coupled to said base of said fourth transistor and a second terminal coupled to said negative voltage source; a fifth NPN transistor having a collector coupled to said collector of said fourth transistor, a base coupled to said collector of said third transistor and an emitter coupled to said negative voltage source; a capacitor coupled between said collector of said fourth transistor and ground.

* * * * *